United States Patent [19]

Fuchs

[11] Patent Number: 4,965,094

[45] Date of Patent: Oct. 23, 1990

[54] ELECTROLESS SILVER COATING FOR DIELECTRIC FILTER

[75] Inventor: Harold E. Fuchs, Kansas City, Mo.

[73] Assignee: AT&T Bell Laboratories, Murray Hill, N.J.

[21] Appl. No.: 292,603

[22] Filed: Dec. 27, 1988

[51] Int. Cl.⁵ .................. H01P 1/20; B05D 3/04; B05D 5/12

[52] U.S. Cl. .................. 427/125; 427/304; 333/202

[58] Field of Search .......... 427/304, 125, 98; 303/202, 203, 204, 206

[56] References Cited

U.S. PATENT DOCUMENTS

| | | |
|---|---|---|
| 3,222,218 | 12/1965 | Beltzer et al. ............... 427/304 |
| 3,776,740 | 12/1973 | Sivertz et al. ............... 106/1.05 |
| 3,830,650 | 8/1974 | Henrikson ................. 106/1.05 |
| 3,983,266 | 9/1976 | Bahls ........................ 427/426 |
| 4,151,494 | 4/1979 | Nishikawa et al. .......... 333/204 |
| 4,460,684 | 7/1984 | Bauer . | |
| 4,523,162 | 6/1985 | Johnson . | |

Primary Examiner—Norman Morgenstern
Assistant Examiner—Margaret Bueker
Attorney, Agent, or Firm—Lester H. Birnbaum

[57] ABSTRACT

Disclosed is a method for forming silver coatings on material, particularly ceramic filter material. The surface is first sensitized by applying thereto a solution comprising a silver ammonia complex and a solution comprising a reducing agent. This forms a thin silver coating which is then silver plated.

6 Claims, 2 Drawing Sheets

ELECTROLESS SILVER COATING FOR DIELECTRIC FILTER

BACKGROUND OF THE INVENTION

This invention relates to silver coating of materials.

One particular device in which a silver coating is especially advantageous is the ceramic filter. Such filters typically include a block of ceramic material with a line of parallel holes and a conductive coating formed over most of the block including the interior portions of the holes. The coated holes function as resonator rods in coupling a selected microwave signal from the input to the output of the filter (see, e.g., U.S. Pat. No. 4,523,162 issued to Johnson, which is incorporated by reference herein).

In such devices, the conductive coating on the surface of the ceramic is preferably silver. However, applying the silver coating can be difficult and expensive in view of the presence of the holes in the ceramic. A typical operation involves painting silver paste on the surface of the ceramic. This usually requires at least two coats and special attention to pushing the paste into the holes. An alternative method of fabrication involves sensitizing the surface with an electroless copper layer, electroplating a thin layer of copper thereon, and then electroplating silver thereover. While adequate, such a conductive coating usually does not provide as good a coupling efficiency as a solid silver coating.

It is, therefore, an object of the invention to provide a relatively inexpensive method for providing silver coatings on ceramic material.

Summary of the Invention

This and other objects are achieved in accordance with the invention which in one aspect is a method of forming a silver coating on the surface of a ceramic material. A solution comprising a silver ammonia complex and a solution comprising a reducing agent are applied to the surface to form the coating.

BRIEF DESCRIPTION OF THE DRAWING

These and other features of the invention are delineated in detail in the following description. In the drawing.

It will be appreciated that for purposes of illustration, the figures are not necessarily drawn to scale.

DETAILED DESCRIPTION

Figure 1:
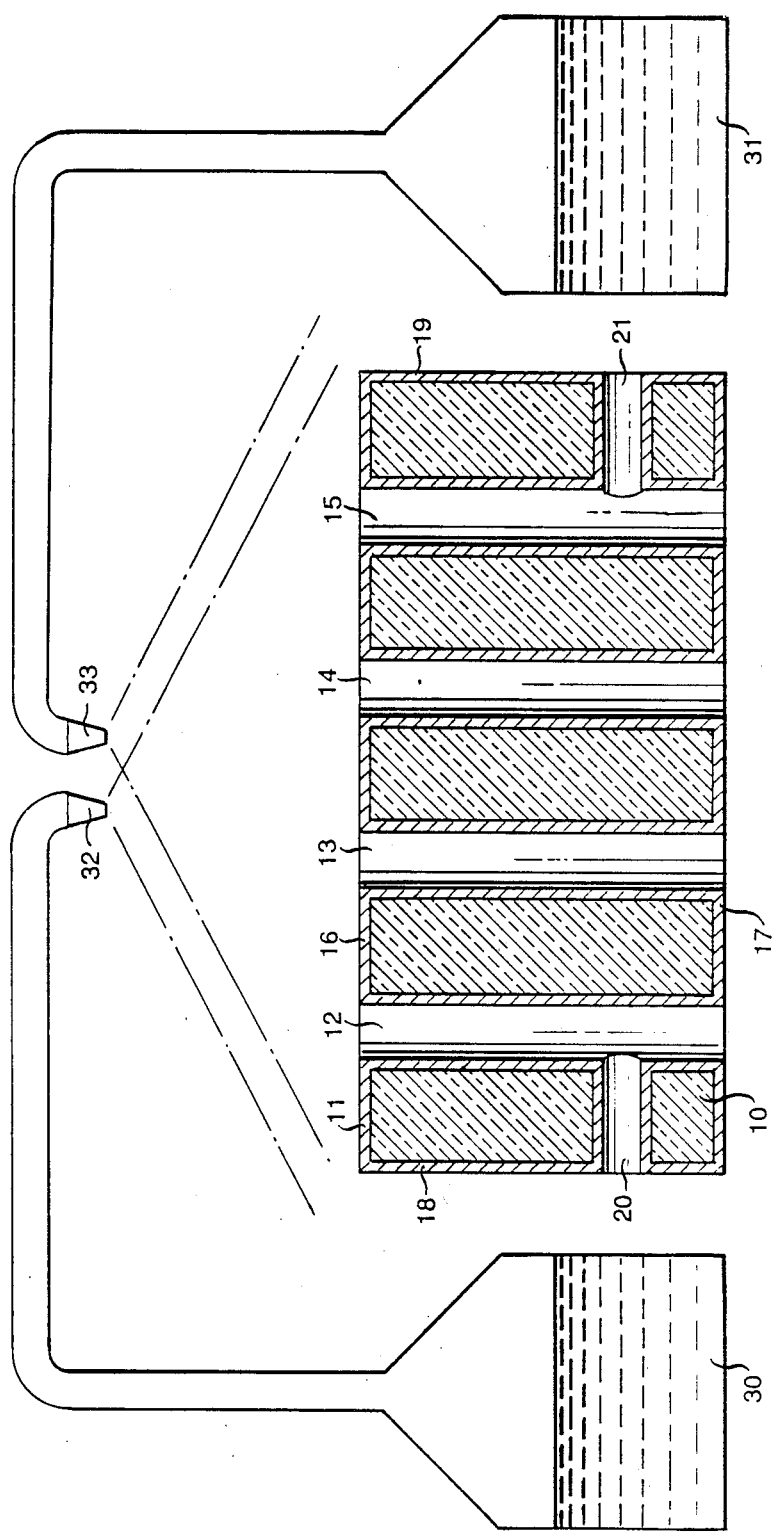
FIG. 1 is a cross-sectional schematic view illustrating one step of the method in accordance with one embodiment of the invention.

FIG. 1 illustrates schematically how a silver coating is formed. The ceramic material, 10, is a block which has a plurality of holes, 12–15, formed entirely through the block from one major surface, 16, to the opposite major surface, 17. Also formed on opposite side surfaces, 18 and 19, are holes 20 and 21 respectively, which extend into the nearest hole, 12 and 15, respectively, running in a perpendicular direction.

The size of the block 10 and the holes 12–15 and 20–21 will depend on the desired frequency band of the final filter. In one particular example, the block had a length of approximately 6 cm and a width of approximately 0.85 cm, and a depth of approximately 1.4 cm. The holes 12–15 had a diameter of approximately 0.4 cm, and the holes 20–21 had a diameter of approximately 0.08 cm. The particular ceramic employed was $Ba_2Ti_4O_{20}$.

To form the final filter, all surfaces of the ceramic, including the walls of the holes 12–15 and 20–21, need to be coated with a conductive material. Thus, in accordance with a main feature of the invention, a thin coating, 11, of silver is first formed on all surfaces of the block including the walls of the holes, as illustrated. In order to accomplish this, a first solution, 30, is prepared which includes a silver ammonia complex. Preferably, such a solution is prepared by mixing silver nitrate and ammonia until a brown precipitate is formed. This brown precipitate ($Ag_2O$) is formed according to the reaction:

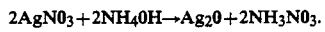

$$2AgNO_3 + 2NH_4OH \rightarrow Ag_2O + 2NH_3NO_3.$$

Additional ammonia is added until the precipitate dissolves according to the following reaction:

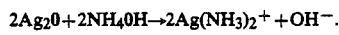

$$2Ag_2O + 2NH_4OH \rightarrow 2Ag(NH_3)_2^+ + OH^-.$$

In a particular example, 50–650 gms/liter of $AgNO_3$ was mixed with 50–80 mL/liter of a 28 percent solution of $NH_4OH$ to produce the solution of $Ag_2O$ and $NH_4OH$. The silver oxide and ammonia solution is known in the industry as Tollens Reagent (see U.S. Pat. No. 4,460,684 issued to Bauer).

Another solution, 31, was also provided in a separate container. This solution included an aldehyde which, in a particular example, was 50–75 mL/liter of 40 percent formaldehyde solution. Each solution, 30 & 31, was coupled to a separate nozzle, 32 and 33, and the solutions were simultaneously sprayed onto the surface of the ceramic 10. The two solutions reacted in equal amounts on the surface to produce the silver coating, 11, according to the reaction:

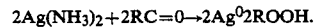

$$2Ag(NH_3)_2 + 2RC = O \rightarrow 2Ag^0 2ROOH.$$

In this example, the solutions were sprayed with a flow rate of approximately 1–8 gals/hr at a pressure of 65 lbs/sq.in. for a period of 15–30 sec. This resulted in a silver coating which was a silver grey color indicating a thickness greater than 500 angstroms. The ceramic (10) was rotated in order to cover all surfaces. A uniform coating was formed on all major surfaces including the walls of the holes 12–15 and 20–21.

Figure 2:
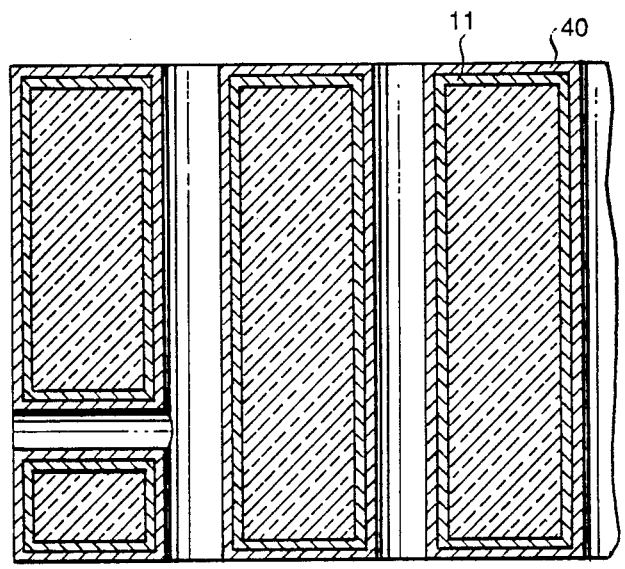
FIG. 2 is a cross-sectional view of part of a ceramic material subsequent to the step illustrated in FIG. 1.

The coating, 11, thus formed prepares the surface of the ceramic for a standard silver plating operation to increase the thickness of the conductive layer. In this example, the coated block was made the cathode in a plating bath of silver cyanide. After approximately 30–60 min., a plated silver layer, (40 of FIG. 2) approximately 0.0025 cm was formed over the silver coating 11 as shown. Again, this layer was formed uniformly over the surfaces of the ceramic including the walls of the holes 12–15 and 20–21.

In subsequent processing, selected portions of the silver layer were removed in accordance with standard techniques to tune the filter and provide an input electrode coupled to hole 20 and an output electrode at hole 21 (see U.S. Pat. No. 4,523,162 cited above). The resulting filters typically had a band width of approximately 20 Hz at a center frequency of 835 Hz. Efficient coupling of the signal through the filter was demonstrated by transmission loss measurements of less than 2.5 dB.

While the invention has been described with reference to a specific embodiment, it will be realized that several variations are possible. For example, the reducing agent need not be an aldehyde, but could be other solutions which reduce silver in a silver ammonia complex. Such materials include sugars, polyhydroxyphenols, hydroxycarboxylic acids, alpha-diketones, primary ketols, sulfinic acid, aminophenols, alkyl and arylhydroxylamines, aromatic amines, hydrazo compounds, and hydrazines. The two solutions, 30 and 31, can be applied successively as well as simultaneously. Further, the invention can be used to fabricate combline filters where all holes are formed in one major surface and extend only partly through the block. In fact, the invention could be useful whenever it is desired to silver coat a dielectric block which includes non-planar surfaces.

Various additional modifications will become apparent to those skilled in the art. Such variations which basically rely on the teachings through which the invention has advanced the art are properly considered within the scope of the invention.

I claim:

1. A method of fabricating a filter from a block of dielectric material which includes a plurality of formed in at least one surface thereof comprising the step of forming a silver coating on said surface including the walls of the holes by applying a solution comprising a silver ammonia complex and a solution comprising a reducing agent.

2. The method according to claim 1 wherein the reducing agent comprises an aldehyde.

3. The method according to claim 1 further comprising electroplating a silver layer over the silver coating.

4. The method according to claim 1 wherein the two solutions are simultaneously sprayed onto the surface.

5. The method according to claim 1 where the solution comprising a silver ammonia complex is formed by reacting silver nitrate with ammonia.

6. The method according to claim 1 wherein the coating is such as to produce a transmission loss in the filter of less than 2.5 dB.

* * * * *

UNITED STATES PATENT AND TRADEMARK OFFICE
CERTIFICATE OF CORRECTION

PATENT NO. : 4,965,094
DATED : October 23, 1990
INVENTOR(S) : Harold E. Fuchs

It is certified that error appears in the above-identified patent and that said Letters Patent is hereby corrected as shown below:

At [56], page 1, in References Cited, add --OTHER PUBLICATIONS--, and then add --Chemical Rubber Handbook, pp. 3047-3048 (1966), "Silvering Glass".--

Column 2, line 40, $$"2 Ag (NH_3)_2 + 2RC = 0 \rightarrow 2 Ag^0\ 2ROOH."$$

should read $$--2 Ag (NH_3)_2 + 2RC = 0 \rightarrow 2 Ag^0 + 2ROOH.--$$

Column 4, line 3, "of formed" should read --of holes formed--.

Signed and Sealed this

Sixteenth Day of April, 1991

Attest:

HARRY F. MANBECK, JR.

Attesting Officer

Commissioner of Patents and Trademarks